US012720867B2

(12) United States Patent
Ai et al.

(10) Patent No.: US 12,720,867 B2
(45) Date of Patent: Aug. 25, 2026

(54) SEMICONDUCTOR DEVICE AND DISPLAY PANEL

(71) Applicant: Wuhan China Star Optoelectronics Technology Co., Ltd., Wuhan (CN)

(72) Inventors: Fei Ai, Wuhan (CN); Zhuang Li, Wuhan (CN); Wenhui Xiong, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 379 days.

(21) Appl. No.: 18/373,361

(22) Filed: Sep. 27, 2023

(65) Prior Publication Data

US 2024/0387556 A1 Nov. 21, 2024

(30) Foreign Application Priority Data

May 18, 2023 (CN) ........................ 202321235871.2

(51) Int. Cl.
*H10D 86/60* (2025.01)
*H10D 86/40* (2025.01)

(52) U.S. Cl.
CPC ........... *H10D 86/60* (2025.01); *H10D 86/421* (2025.01)

(58) Field of Classification Search
CPC ...... H10D 86/60; H10D 86/421; H10D 30/67; H10D 30/6729; H10D 30/673; H10D 30/6755; H10D 30/6757
See application file for complete search history.

(56) References Cited

U.S. PATENT DOCUMENTS

2016/0071887 A1* 3/2016 Chao .................. H10K 59/1216 257/72
2022/0308413 A1* 9/2022 Liao .................... G02F 1/13606

* cited by examiner

*Primary Examiner* — Timor Karimy

(57) ABSTRACT

A semiconductor device and a display panel are disclosed. The semiconductor device includes an insulating substrate and a thin film transistor on the insulating substrate. The thin film transistor includes a protrusion and an active layer. The protrusion includes a first sub-protrusion on the insulating substrate, and a second sub-protrusion on the first sub-protrusion. The second sub-protrusion completely covers a side of the first sub-protrusion away from the insulating substrate. The active layer includes a first ohmic contact portion, a channel portion connected to the first ohmic contact portion, and a second ohmic contact portion connected to the channel portion. The first ohmic contact portion is at least partially disposed on the insulating substrate. The channel portion is fitted to a side surface of the first sub-protrusion and a side surface of the second sub-protrusion.

18 Claims, 4 Drawing Sheets

SEMICONDUCTOR DEVICE AND DISPLAY PANEL

CROSS-REFERENCE TO RELATED APPLICATION

This application claims the benefit of priority of Chinese Application No. 202321235871.2, filed on May 18, 2023, the contents of which are incorporated by reference as if fully set forth herein in their entirety.

FIELD

The present disclosure generally relates to the field of display technology, and more particularly, to a semiconductor device and a display panel.

BACKGROUND

A system on glass (SOG) that integrates IC circuits such as PIXEL, GOA, MUX, SOURCE, and TCON on a glass substrate can greatly improve integration of a display panel, reduce dependence on an IC, and reduce costs. However, implementing SOG requires increasing the integration, maximum operating frequency, and current density of existing thin film transistors (TFT), which require TFTs to have shorter channel lengths, higher mobility, and smaller volumes.

SUMMARY

According to the present disclosure, it is provided a semiconductor device and a display panel, which can reduce volume and channel length of a thin film transistor and implement high integration of an IC circuit on an insulating substrate, thereby implementing SOG technology.

According to the present disclosure, a semiconductor device includes an insulating substrate and a thin film transistor on the insulating substrate. The thin film transistor includes: a protrusion on a side of the insulating substrate, the protrusion including a first sub-protrusion on the insulating substrate and a second sub-protrusion on the first sub-protrusion, and a bottom surface of the second sub-protrusion completely covering a side of the first sub-protrusion away from the insulating substrate; and an active layer, the active layer including a first ohmic contact portion, a channel portion connected to the first ohmic contact portion, and a second ohmic contact portion connected to the channel portion, the first ohmic contact portion being at least partially disposed on the insulating substrate, the channel portion being fitted to a side surface of the first sub-protrusion and the second sub-protrusion, and the second ohmic contact part being disposed on a side of the second sub-protrusion far away from the first sub-protrusion.

Optionally, a side surface of the first sub-protrusion includes a first sub side surface being fitted to the channel portion. The first sub side surface is connected to a side surface of the second sub-protrusion. An included angle between the side surface of the second sub-protrusion and a bottom surface of the first sub-protrusion is greater than or equal to 85° and less than or equal to 95°, and an included angle between the first sub side surface and the bottom surface of the first sub-protrusion is greater than or equal to 85° and less than or equal to 95°.

Optionally, the side surface of the first sub-protrusion further includes a second sub side surface connected to the first sub side surface. The first sub side surface is disposed between the second sub side surface and a side surface of the second sub-protrusion. The channel portion is further fitted to the second sub side surface. An included angle between the second sub side surface and the bottom surface of the first sub-protrusion is less than the included angle between the first sub side surface and the bottom surface of the first sub-protrusion.

Optionally, an included angle between the second sub side surface and the bottom surface of the first sub-protrusion is greater than or equal to 30° and less than or equal to 60°.

Optionally, a thickness of the first sub-protrusion is greater than a thickness of the second sub-protrusion, and an etch resistance of the second sub-protrusion is greater than an etch resistance of the first sub-protrusion.

Optionally, a material of the first sub-protrusion includes silicon oxide. A material of the second sub-protrusion includes polysilicon.

Optionally, the channel portion is disposed on a side of the second ohmic contact portion close to the insulating substrate. The first ohmic contact portion does not overlap with the second ohmic contact portion.

Optionally, materials of the first ohmic contact portion and the second ohmic contact portion include polysilicon doped with predetermined ions, and doping concentrations of the first ohmic contact portion and the second ohmic contact portion are same. The material of the ohmic contact portion includes undoped polysilicon.

Optionally, a thickness of the first ohmic contact portion and a thickness of the second ohmic contact portion are same and are greater than a thickness of the second sub-protrusion. A material of the second sub-protrusion includes polysilicon doped with predetermined ions. A doping concentration of the second sub-protrusion is less than a doping concentration of the second ohmic contact portion.

According to the present disclosure, a display panel includes the semiconductor device described above and a light-emitting functional layer on the semiconductor device.

According to the semiconductor device and the display panel according to the present disclosure, a protrusion in a thin film transistor is provided by superimposing a first sub-protrusion and a second sub-protrusion. A bottom surface of the second sub-protrusion completely covers a side of the first sub-protrusion away from an insulating substrate, so that the second sub-protrusion is directly used as a hard mask plate in the process of forming the first sub-protrusion. A channel portion is fitted to a side surface of the first sub-protrusion and a side surface of the second sub-protrusion, thereby facilitating formation of a channel portion of a vertical structure. On one hand, the channel portion of the vertical structure can effectively shorten a channel length, so that the number of grain boundaries in a single channel is reduced, thereby improving the mobility of the thin film transistor. On the other hand, the channel portion of the vertical structure can effectively reduce a volume of the thin film transistor, facilitating an increase of the number of thin film transistors on the insulating substrate per unit area, so as to facilitate an increase of the integration of the thin film transistor. Therefore, embodiments of the present disclosure facilitate increases of integration, maximum operating frequency, and current density of the thin film transistor in a semiconductor device, thereby implementing the high integration of IC circuits on the insulating substrate, so as to implement the SOG technology.

DESCRIPTION OF DRAWINGS

The technical solution and other beneficial effects of the present disclosure will be apparent from the following detailed description of specific embodiments thereof, taken in conjunction with the accompanying drawings.

DETAILED DESCRIPTION

Figure 1:
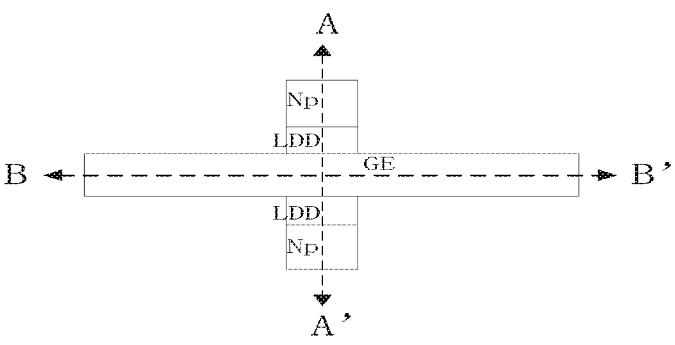
FIG. 1 is a structural schematic diagram of a local top view of an existing semiconductor device.

Technical solutions in the embodiments of the present disclosure will be clearly and completely described with reference to the accompanying drawings. It will be apparent that the described embodiments are only part of the examples of the present disclosure, and not all examples. Based on the embodiments in the present disclosure, all other embodiments obtained by a person skilled in the art without involving any inventive effort are within the scope of the present disclosure.

In the description of the present disclosure, it is to be understood that the orientation or positional relationship indicated by the terms "center", "longitudinal", "transverse", "length", "width", "thickness", "up", "down", "front", "back", "left", "right", "vertical", "horizontal", "top", "bottom", "in", "out", "clockwise", "counterclockwise", and the like, is based on the orientation or positional relationship shown in the drawings, merely to facilitate description of the present disclosure and to simplify the description, and is not intended to indicate or imply that the device or element referred to must have a particular orientation, be constructed and operated in a particular orientation, and therefore is not to be construed as limiting the present disclosure. Furthermore, the terms "first" and "second" are used for descriptive purposes only and are not to be construed as indicating or implying relative importance or implying the number of indicated technical features. Thus, features limited to "first" and "second" may explicitly or implicitly include one or more of the features. In the description of the present disclosure, "plurality" means two or more, unless expressly and specifically defined otherwise.

In the description of the present disclosure, it is to be noted that, unless expressly stated and defined otherwise, the terms "install", "connect" are to be understood in a broad sense, for example, as a fixed connection, as a detachable connection, as an integrated connection, as an mechanical connection, an electrical connection, as an communication with each other, as an direct connection, as an indirect connection by means of an intermediate medium, as an internal communication of two elements, or as an interaction of two elements. The specific meaning of the above terms in the present disclosure may be understood by one of ordinary skill in the art depending on the specific circumstances.

In the present disclosure, unless expressly stated and defined otherwise, a first feature being "on" or "under" a second feature may include a direct contact of the first feature and the second feature, as well as contact of the first feature and the second feature by additional features therebetween. The first feature being "above" the second feature includes that the first feature is directly above and obliquely above the second feature, or merely indicates that a horizontal height of the first feature is greater than that of the second feature. The first feature being "below" the second feature includes that the first feature is directly below and obliquely below the second feature, or merely indicating that a horizontal height of the first feature level is less than that of the second feature.

The following disclosure provides many different embodiments or examples for implementing the different structures of the present disclosure. In order to simplify the disclosure of the present disclosure, components and arrangements of specific examples are described below. Of course, they are merely examples and are not intended to limit the present disclosure. In addition, the present disclosure may repeat reference numerals and/or reference letters in various examples. Such repetition is for the purpose of simplicity and clarity, without indicating a relationship between the various embodiments and/or arrangements discussed. In addition, the present disclosure provides examples of various specific processes and materials, but one of ordinary skill in the art will recognize other processes and/or the use of other materials.

Figure 2:
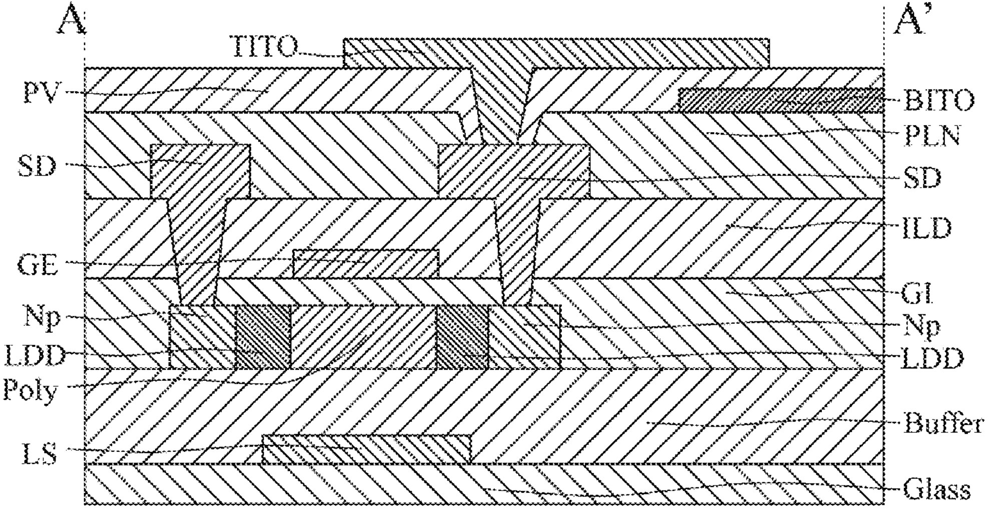
FIG. 2 is a structural schematic diagram of a cross section at A-A' in FIG. 1.
Figure 3:
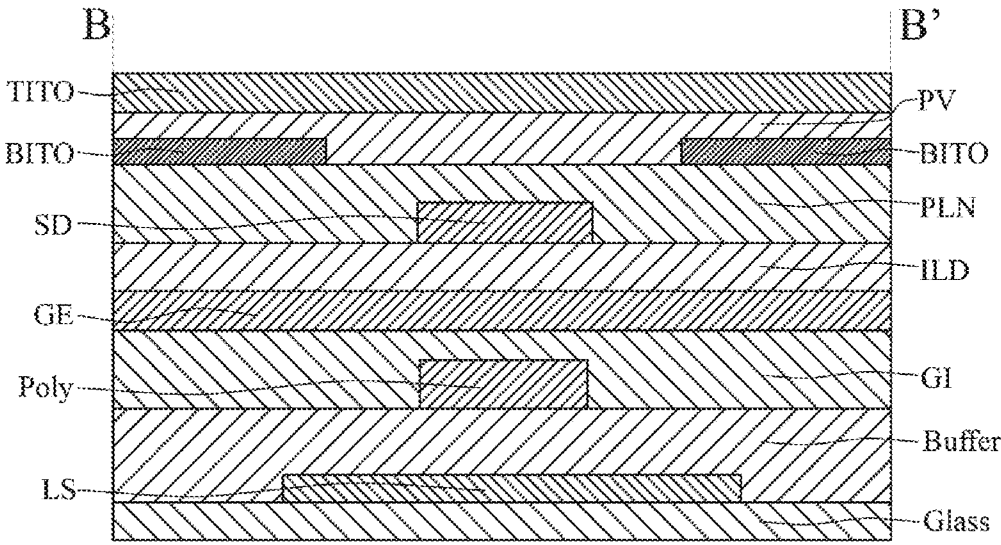
FIG. 3 is a structural schematic diagram of a cross section at B-B' in in FIG. 1.

FIG. 1 is a structural schematic diagram of a local top view of an existing semiconductor device. FIG. 2 is a structural schematic diagram of a cross section at A-A' in FIG. 1. FIG. 3 is a structural schematic diagram of a cross section at B-B' in in FIG. 1. Glass is a substrate layer. LS is a light shielding layer. Buffer is a buffer layer. Poly is a polysilicon layer. LDD is a lightly doped portion. Np is an N-type heavily doped portion. GI is a gate insulating layer. GE is a gate. ILD is an interlayer insulating layer. SD is a source-drain layer. PLN is a planarization layer. BITO is a bottom ITO electrode layer. PV is a passivation layer. TITO is a top ITO electrode layer. A semiconductor device shown in FIG. 1 to FIG. 3 includes a LTPS-type thin film transistor. An entire active layer of the thin film transistor is on a same plane. For example, a channel portion (Poly), a lightly doped portion (LDD), and an N-type heavily doped portion (Np) of the active layer are disposed on the same plane. Due to limitations of an exposure process and an etching process, a channel length of the thin film transistor is generally 2 microns or more, and there is are many grain boundaries in the channel, resulting in a low mobility, a small on-state current, and a large volume of the thin film transistor, which is conductive to improve the integration of the display panel, and therefore conductive to implement the SOG technology.

It will be appreciated that the above-described semiconductor device may be an component of an array substrate in a display panel.

To solve the above technical problem, according to the present disclosure, it is provided a semiconductor device and a display panel including a thin film transistor having a vertical structure, with specific reference to the description of the following embodiments.

Figure 4:
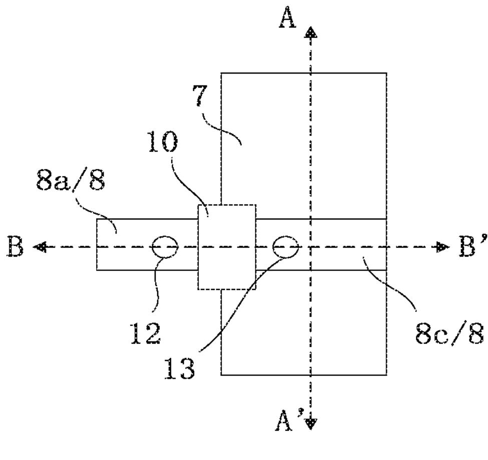
FIG. 4 is a structural schematic diagram of a local top view of a semiconductor device according to an embodiment of the present disclosure.
Figure 5:
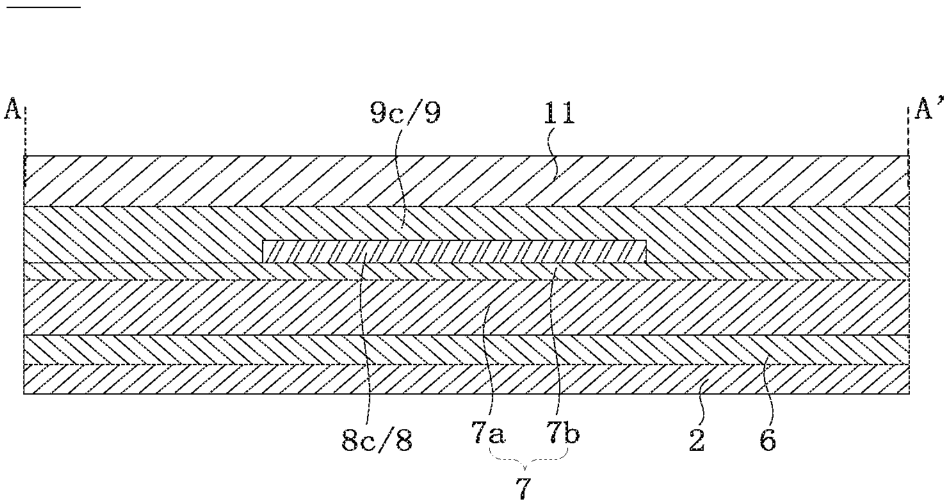
FIG. 5 is a structural schematic diagram of a cross section at A-A' in FIG. 4.
Figure 6:
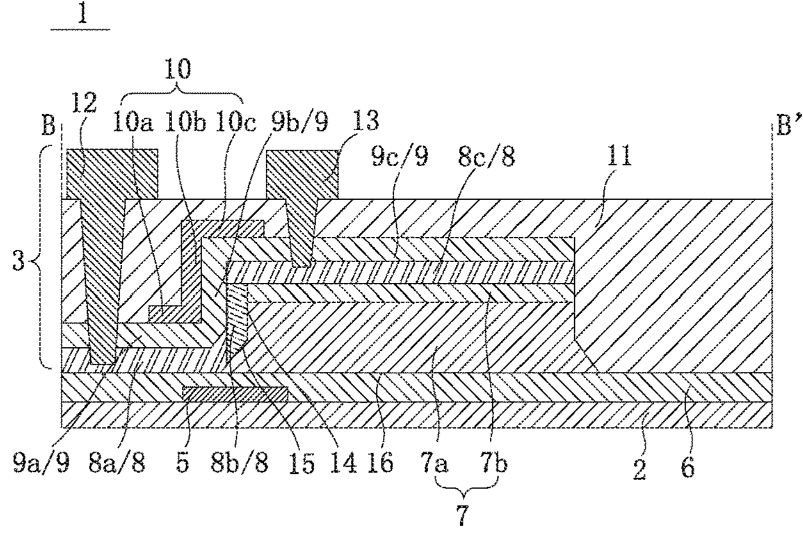
FIG. 6 is a structural schematic diagram of a cross section at B-B' in FIG. 4.
Figure 7:
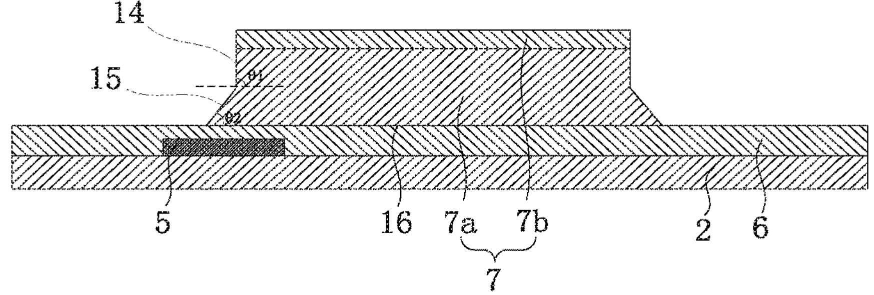
FIG. 7 is a structural schematic diagram of a cross section of an insulating substrate, a light shielding layer, a buffer layer, and a protrusion in a semiconductor device according to an embodiment of the present disclosure.

FIG. 4 is a structural schematic diagram of a local top view of a semiconductor device according to an embodiment of the present disclosure. FIG. 5 is a structural schematic diagram of a cross section at A-A' in FIG. 4. FIG. 6 is a structural schematic diagram of a cross section at B-B' in FIG. 4. FIG. 7 is a structural schematic diagram of a cross section of an insulating substrate, a light shielding layer, a buffer layer, and a protrusion in a semiconductor device according to an embodiment of the present disclosure.

As shown in FIG. 4 to FIG. 7, according to an embodiment of the present disclosure, a semiconductor device 1 includes an insulating substrate 2 and a thin film transistor 3 on the insulating substrate 2.

Specifically, a material of the insulating substrate 2 includes glass (Glass), which is not limited herein. The insulating substrate 2 may be a flexible substrate or a rigid substrate, which is not limited herein.

In an embodiment, as shown in FIG. 6, the semiconductor device 1 further includes a buffer layer (Buffer) 6 between the insulating substrate 2 and the thin film transistor 3.

In another embodiment, as shown in FIG. 6, the semiconductor device 1 further comprises a light shielding layer (LS) 5 between the insulating substrate 2 and the buffer layer 6.

Specifically, the light shielding layer 5 at least corresponds to channel (for example, a channel portion **8*b* hereinafter) of the thin film transistor 3**.

Specifically, as shown in FIG. 6, the thin film transistor 3 includes a protrusion 7, an active layer 8, a gate insulating layer (GI) 9, a gate (GE) 10, an interlayer insulating layer (ILD) 11, a source(S) 12, and a drain (D) 13. Specifically, the protrusion 7 and part of the active layer 8 are disposed on the buffer layer 6.

Specifically, as shown in FIG. 6, the protrusion 7 is disposed on a side of the insulating substrate 2, and specifically on the buffer layer 6. The active layer 8 includes a first ohmic contact portion **8*a*, a channel portion 8*b* connected to the first ohmic contact portion 8*a*, and a second ohmic contact portion 8*c* connected to the channel portion 8*b*. The first ohmic contact portion 8*a* is disposed at least partially on a side of the insulating substrate 2 not covered by the protrusion 7. The channel portion 8*b* is disposed on a side surface of the protrusion 7, The second ohmic contact portion 8*c* is disposed on a side of the protrusion 7 away from the insulating substrate 2**.

It will be appreciated that under a condition that the buffer layer 6 is disposed between the insulating substrate 2 and the thin film transistor 3, the first ohmic contact portion **8*a* is at least partially disposed on the buffer layer 6 not covered by the protrusion 7**.

Specifically, as shown in FIG. 6, the protrusion 7 includes a first sub-protrusion **7*a* on the insulating substrate 2 and a second sub-protrusion 7*b* on the first sub-protrusion 7*a*. A side of the first sub-protrusion 7*a* away from the insulating substrate 2 is completely covered by a bottom surface of the second sub-protrusion 7*b*. The channel portion 8*b* is fitted to a side surface of the first sub-protrusion 7*a* and a side surface of the second sub-protrusion 7*b*. The second ohmic contact portion 8*c* is disposed on a side of the second sub-protrusion 7*b* away from the first sub-protrusion 7*a***.

It will be appreciated that under a condition that the buffer layer 6 is disposed between the insulating substrate 2 and the thin film transistor 3, the first sub-protrusion **7*a* is disposed on the buffer layer 6, and the second sub-protrusion 7*b* is disposed on the first sub-protrusion 7*a***.

Specifically, an included angle between the side surface of the first sub-protrusion **7*a* and the bottom surface of the first sub-protrusion 7*a* is less than or equal to an included angle between the side surface of the second sub-protrusion 7*b* and the bottom face of the first sub-protrusion 7*a*, and an included angle between the side surface of the second sub-protrusion 7*b* and the bottom surface of the first sub-protrusion 7*a*** is greater than or equal to 85° and smaller than or equal to 95°.

It will be appreciated that the included angle between the side surface of the first sub-protrusion **7*a* and the bottom surface of the first sub-protrusion 7*a* is a taper angle of the first sub-protrusion 7*a*, and the included angle between the side surface of the second sub-protrusion 7*b* and the bottom surface of the first sub-protrusion 7*a* is a taper angle of the second sub-protrusion 7*b*. That is, the taper angle of the second sub-protrusion 7*b* is greater than or equal to 85° and less than or equal to 95°, and the taper angle of the first sub-protrusion 7*a* is less than or equal to the taper angle of the second sub-protrusion 7*b***.

Specifically, as shown in FIG. 6 and FIG. 7, the side surface of the first sub-protrusion **7*a* includes a first sub side surface 14 fitted to the channel portion 8*b*. An included angle θ1 between the first sub side surface 14 and the bottom surface 16 of the first sub-protrusion 7*a*** is greater than or equal to 85° and less than or equal to 95°.

It will be appreciated that the first sub side surface 14 of the first sub-protrusion **7*a* is disposed in perpendicular to or nearly in perpendicular to the insulating substrate 2 so that the channel portion 8*b* disposed on the side surface of the protrusion 7 is disposed perpendicularly. Thus the channel length of the channel portion 8*b* is equal to a height (i.e., thickness) of the protrusion 7. Therefore, the channel length of the active layer 8** according to an embodiment of the present disclosure can be controlled by a film forming and etching parameter, and a short channel device having a channel length of less than 1 micron (μm) can be manufactured by breaking through an accuracy of an existing exposure machine.

It should be noted that the height (thickness) of the protrusion 7 is the thickness of the protrusion 7 in a direction perpendicular to the insulating substrate 2, specifically a sum of a height (thickness) of the first sub-protrusion **7*a* and a height (thickness) of the second sub-protrusion 7*b***.

Specifically, the channel length of the channel portion **8*b*** is greater than or equal to 0.01 micron and less than or equal to 1 micron.

Specifically, the first sub side surface 14 may be an entire side surface of the first sub-protrusion **7*a*, or may be a partial side surface of the first sub-protrusion 7*a***.

In an embodiment, as shown in FIG. 6 and FIG. 7, the side surface of the first sub-protrusion **7*a* further includes a second sub side surface 15 connected to the first sub side surface 14. The first sub side surface 14 is disposed close to the second ohmic contact portion 8*c*, and the second sub side surface 15 is disposed close to the insulating substrate 2. The channel portion 8*b* is also fitted to the second sub side surface 15. An included angle θ2 between the second sub side surface 15 and the bottom surface 16 of the first sub-protrusion 7*a* is less than the included angle θ1 between the first sub side surface 14 and the bottom surface 16 of the first sub-protrusion 7*a***.

It will be appreciated that the first sub side surface 14 is disposed between the second sub side surface 15 and the side surface of the second sub-protrusion **7*b***.

Specifically, the included angle θ2 between the second sub side surface 15 and the bottom surface 16 of the first sub-protrusion 7*a* is greater than or equal to 30° and less than or equal to 60°.

It will be appreciated that the second sub side surface 15 enables the side surface of the first sub-protrusion 7*a* to transition at a slow angle to the insulating substrate 2 (or the buffer layer 6) in a planar form, facilitating an improvement a risk of wire breakage during deposition and crystallization of the active layer 8.

Specifically, the thickness of the first sub-protrusion 7*a* is greater than that of the second sub-protrusion 7*b*, and an etching resistance of the second sub-protrusion 7*b* is greater than that of the first sub-protrusion 7*a*. In an embodiment, hardness of the second sub-protrusion 7*b* is greater than hardness of the first sub-protrusion 7*a*.

It will be appreciated that the etch resistance of the second sub-protrusion 7*b* is greater than the etch resistance of the first sub-protrusion 7*a* for the same etching material.

In an embodiment, the material of the first sub-protrusion 7*a* includes an inorganic material, such as silicon oxide (SiO). The material of the second sub-protrusion 7*b* includes polysilicon (Ploy).

Existing etching techniques usually use a photoresist as a mask plate. However, when etching a SiO layer below the photoresist mask plate, part of a surface (for example, a side surface) of the photoresist is also etched away, so that a desired mask effect cannot be achieved, and consequently, a predetermined SiO pattern cannot be obtained, and an obtained SiO protrusion is difficult to obtain a taper angle of 90° or nearly 90° due to an excessive etching on the side surface. However, according to an embodiment of the present disclosure, a laminated structure of the first sub-protrusion 7*a* and the second sub-protrusion 7*b* is used as the protrusion 7. A material of the second sub-protrusion 7*b* is polycrystalline silicon, which is more resistant to etching than photoresist and the first sub-protrusion 7*a*, and it is easier to control the tap angle of the second sub-protrusion 7*b* to be approximately 90°. Therefore, when the protrusion 7 is manufactured, a second sub-protrusion 7*b* with a taper angle of approximately 90° may be first obtained by etching, then etching is made by using the second sub-protrusion 7*b* as a hard mask plate, so as to obtain the second sub protrusion structure 7*b* with a tap angle of 90° or nearly 90°. That is, the included angle θ1 between the first sub side surface 14 of the first sub-protrusion 7*a* and the bottom surface 16 of the first sub-protrusion 7*a* meets the requirement of greater than or equal to 85° and less than or equal to 95°.

Figure 8:
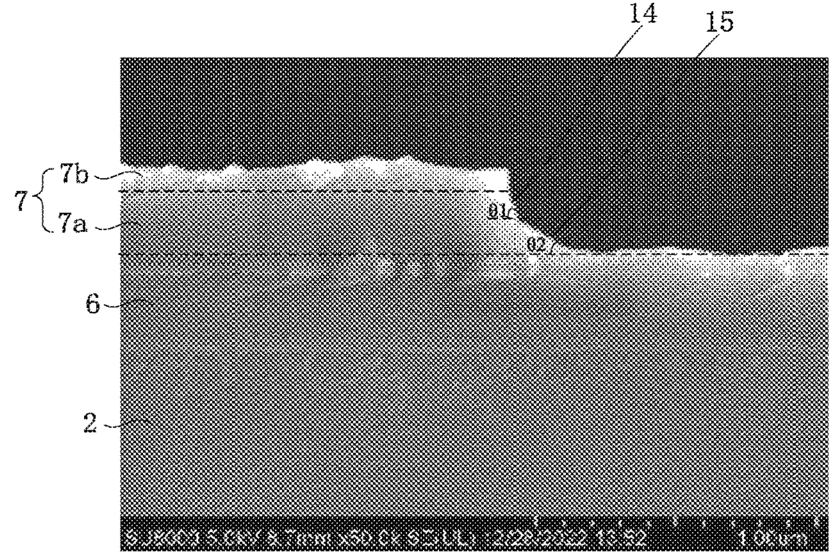
FIG. 8 is a local electron microscope photo of an insulating substrate, a buffer layer, and a protrusion in a semiconductor device according to an embodiment of the present disclosure.

FIG. 8 is a local electron microscope photo of an insulating substrate, a buffer layer, and a protrusion in a semiconductor device according to an embodiment of the present disclosure. As shown in FIG. 8, the protrusion 7, the buffer layer 6, and the insulating substrate 2 are laminated on a horizontal plane. The second sub-protrusion 7*b* has a taper angle of 90°. The side surface of the first sub-protrusion 7*a* includes a first sub side surface 14 and a second sub side surface 15. The included angle θ1 between the first sub side surface 14 of the first sub-protrusion 7*a* and the bottom surface 16 (or a horizontal plane) of the first sub-protrusion 7*a* is close to 90°. The included angle θ1 between the first sub side surface 14 of the first sub-protrusion 7*a* and the bottom surface 16 (or a horizontal plane) of the first sub-protrusion 7*a* is greater than an included angle θ2 between the second sub side surface 15 of the first sub-protrusion 7*a* and the bottom surface 16 (or the horizontal plane) of the first sub-protrusion 7*a*. So that the side surface of the first sub-protrusion 7*a* can transition to the buffer layer 6 in a planar form at a slow angle, thereby improving the risk of wire breakage of the active layer during deposition and crystallization.

In an embodiment, the side surface of the second sub-protrusion 7*b* and the first sub side surface 14 are disposed on a plane (not shown). For example, an included angle between the first sub side surface 14 of the first sub-protrusion 7*a* and the bottom surface 16 of the first sub-protrusion 7*a* and an included angle between the side surface of the second sub-protrusion 7*b* and the bottom surface 16 of the first sub-protrusion 7*a* are both equal to 90°. The first sub side surface 14 of the first sub-protrusion 7*a* is flush with the side surface of the second sub-protrusion 7*b*.

Specifically, the channel portion 8*b* is disposed on a side of the second ohmic contact portion 8*c* close to the insulating substrate 2. The first ohmic contact portion 8*a* and the second ohmic contact portion 8*c* do not overlap. As shown in FIG. 6, in an embodiment, a distance between an orthographic projection of the first ohmic contact portion 8*a* on the insulating substrate 2 and an orthographic projection of the second ohmic contact portion 8*c* on the insulating substrate 2 is equal to 0. Under the condition, the orthographic projection of the second ohmic contact portion 8*c* on the insulating substrate 2 completely covers the orthographic projection of the channel portion 8*b* on the insulating substrate 2.

It will be appreciated that the first ohmic contact portion 8*a* and the second ohmic contact portion 8*c* are disposed horizontally. The channel portion 8*b* is disposed in perpendicular to the first ohmic contact portion 8*a* and the second ohmic contact portion 8*c*, so that the channel length of the thin film transistor 3 is equal to the height of the protrusion 7.

In an embodiment, materials of the first ohmic contact portion 8*a* and the second ohmic contact portion 8*c* include polysilicon doped with predetermined ions. For example, the predetermined ions are N-type heavily doped ions. For case of description, the predetermined ions will be referred to as Np ions hereinafter for short. Doping concentrations of the first ohmic contact portion 8*a* and the second ohmic contact portion 8*c* are same. The material of the channel portion 8*b* includes undoped polysilicon.

Specifically, when the active layer 8 is manufactured, a polysilicon layer may be first deposited on a side of the protrusion 7 away from the insulating substrate 2, and extended to the side surface of the protrusion 7 and the insulating substrate 2. Np ion implantation is then performed to the polysilicon layer. By controlling ion implantation parameters, the polysilicon layer disposed on the side surface of the protrusion 7 is not doped, thereby forming an undoped channel portion 8*b*, a heavily doped first ohmic contact portion 8*a* and a heavily doped second ohmic contact portion 8*c*.

Specifically, when ion implantation is then performed to the polysilicon layer, a direction of the ion implantation is perpendicular to the insulating substrate 2. By controlling the included angle θ1 between the first sub side surface 14 of the protrusion 7 and the bottom surface 16 of the protrusion 7 to be approximately 90°, and then controlling a depth of the ion implantation, the polysilicon layer disposed on the side surface of the protrusion 7 is not implanted by ions, thus forming the channel portion 8*b*.

Since the first ohmic contact portion 8*a* and the second ohmic contact portion 8*c* can be formed in a same process, the first ohmic contact portion 8*a* and the second ohmic contact portion 8*c* have a same thickness.

Specifically, the thickness of the first ohmic contact portion 8a and the thickness of the second ohmic contact portion 8c are greater than the thickness of the second sub-protrusion 7b. In an embodiment, the material of the second sub-protrusion 7b is undoped polysilicon. In another embodiment, the material of the second sub-protrusion 7b includes polysilicon doped with the predetermined ions. That is, the doped ions of the second sub-protrusion 7b are same as the doped ions of the first ohmic contact portion 8a and the doped ions of the second ohmic contact portion 8c. The doping concentration of the second sub-protrusion 7b is less than the doping concentration of the first ohmic contact portion 8a and the doping concentration of the second ohmic contact portion 8c.

Note that the second sub-protrusion 7b is not doped with the predetermined ions before the formation of the active layer 8. Since the material of the second sub-protrusion 7b is also polysilicon, the second sub-protrusion 7b is also implanted with Np ions when implanting Np ions to the polysilicon layer during the process of manufacturing the active layer 8. By controlling dosage (e.g., $4\times10^{14}/cm^2$) and the energy (15 KeV) of the Np ion implantation, preferably the Np ion concentration peaks being at the first ohmic contact portion 8a and the second ohmic contact portion 8c, the Np ion concentration in the second sub-protrusion 7b is lower than the Np ion concentration in the channel portion 8b.

Figure 9:
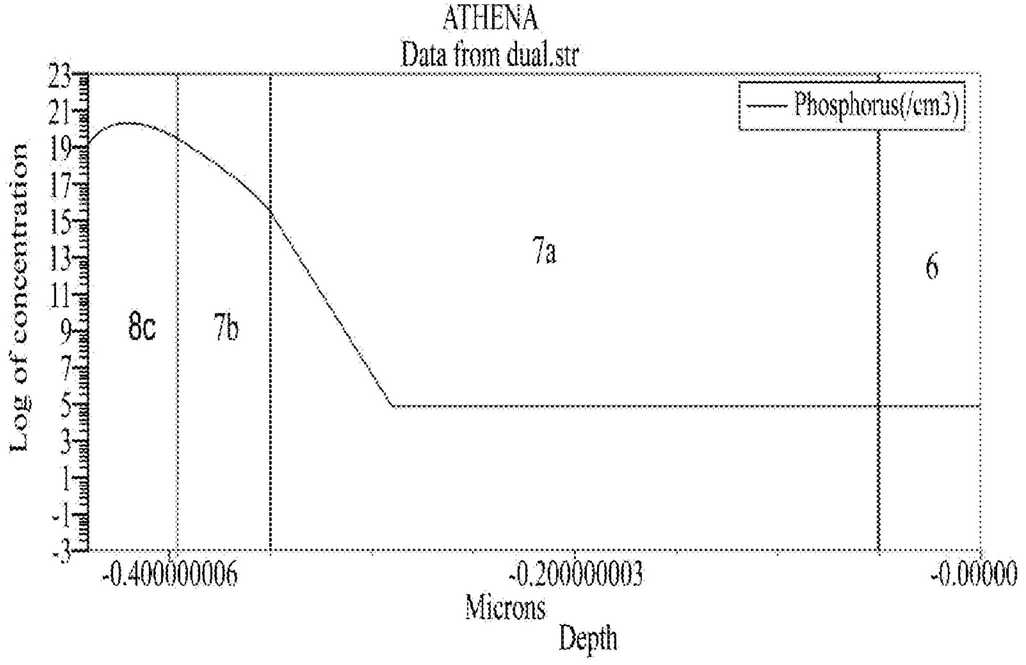
FIG. 9 is a schematic diagram of doping concentration distribution of a second ohmic contact portion, a first sub-protrusion, a second sub-protrusion, and a buffer layer in a semiconductor device according to an embodiment of the present disclosure.

FIG. 9 is a schematic diagram of doping concentration distribution of a second ohmic contact portion, a first sub-protrusion, a second sub-protrusion, and a buffer layer in a semiconductor device according to an embodiment of the present disclosure. As shown in FIG. 9, the concentration of Np ions in the second ohmic contact portion 8c is greater than the concentration of Np ions in the second sub-protrusion 7b, and the concentration of Np ions in the second sub-protrusion 7b is greater than the concentration of Np ions in the first sub-protrusion 7a. After reaching the lowest value the first sub-protrusion 7a, the concentration of Np ions is kept unchanged. A peak value of the Np ion concentration is at the second ohmic contact portion 8c.

Specifically, the first ohmic contact portion 8a may be completely disposed on the insulating substrate 2 (or the buffer layer 6), and may extend to the side surface of the protrusion 7. As shown in FIG. 6, most of the first ohmic contact portion 8a is disposed on the buffer layer 6, and part of the first ohmic contact portion 8a close to the channel portion 8b extends to the second sub side surface 15 of the first sub-protrusion 7a. It will be appreciated that whether the first ohmic contact portion 8a extends to the side surface of the protrusion 7 depends on the inclination of the side surface of the protrusion 7 and the lateral width of the channel portion 8b.

Specifically, as shown in FIG. 6, the gate insulating layer 9 is disposed on the active layer 8, and specifically covers the first ohmic contact portion 8a, the channel portion 8b, and the second ohmic contact portion 8c.

Specifically, the gate insulating layer 9 includes a first sub-insulating portion 9a, a second sub-insulating portion 9b, and a third sub-insulating portion 9c which are continuously. The first sub-insulating portion 9a corresponds to the first ohmic contact portion 8a. The second sub-insulating portion 9b corresponds to the channel portion 8b. The third sub-insulating portion 9c corresponds to the second ohmic contact portion 8c.

Specifically, the first sub-insulating portion 9a and the second sub-insulating portion 9b are disposed horizontally. The second sub-insulating portion 9b of the gate insulating layer 9 is disposed perpendicular to or nearly perpendicular to the first sub-insulating portion 9a and the second sub-insulating portion 9b.

Specifically, as shown in FIG. 6, the gate electrode 10 is disposed on a side surface of the active layer 8 away from the insulating substrate 2, and specifically on the gate insulating layer 9. The orthographic projection of the gate electrode 10 on the insulating substrate 2 completely covers the orthographic projection of the channel portion 8b on the insulating substrate 2, and covers an orthographic projection of part of the first ohmic contact portion 8a and an orthographic projection of part of the second ohmic contact portion 8c on the insulating substrate 2.

Specifically, the gate 10 includes a first sub-gate 10a, a second sub-gate 10b, and a third sub-gate 10c which are continuously. The first sub-gate 10a is disposed on the first sub-insulating portion 9a. The second sub-gate 10b is fitted to the second sub-insulating portion 9b. The third sub-gate 10c is disposed on the third sub-insulating portion 9c.

Specifically, the first sub-gate 10a and the second sub-gate 10b are disposed horizontally. The second sub-gate 10b is disposed perpendicular to or nearly perpendicular to the first sub-gate 10a and the second sub-gate 10b. The design not only satisfies a regulation of the entire channel portion 8b by the gate 10, but also reduces the length of the gate 10 in the horizontal direction, thereby facilitating the volume reduction of the entire thin film transistor 3.

Specifically, the interlayer insulating layer 11 covers the gate insulating layer 9, the gate electrode 10, and the insulating substrate 2 not covered by the protrusion 7.

Specifically, a side of the interlayer insulating layer 11 away from the insulating substrate 2 may be flat. Of course, a planarization layer may be provided on a side surface of the interlayer insulating layer 11 away from the insulating substrate 2 to achieve planarization.

Specifically, the source electrode 12 and the drain electrode 13 are disposed on a side of the gate electrode 10 away from the insulating substrate 2 and connected to the first ohmic contact portion 8a and the second ohmic contact portion 8c respectively.

Specifically, the source electrode 12 and the drain electrode 13 are disposed at a side of the interlayer insulating layer 11 away from the insulating substrate 2, and correspond to the first ohmic contact portion 8a and the second ohmic contact portion 8c respectively. Through via holes throughout the interlayer insulating layer 11 and the gate insulating layer 9, the source electrode 12 and the drain electrode 13 are in contact with corresponding first ohmic contact portion 8a and corresponding second ohmic contact portion 8c respectively.

Specifically, a side of the source electrode 12 close to the active layer 8 and a side of the drain electrode 13 close to the active layer 8 may also extend to an interior of the corresponding first ohmic contact portion 8a and an interior of the second ohmic contact portion 8c respectively, so as to increase the contact area, thereby ensuring the stability of the electrical connection.

Specifically, the semiconductor device 1 may further include a planarization layer (not shown) covering the source electrode 12, the drain electrode 13, and the interlayer insulating layer 11, which is not limited herein.

In an embodiment, the channel portion 8b in the thin film transistor 3 is fitted to the side surface of the land structure 7, so that the channel portion 8b is perpendicular to the insulating substrate 2. On one hand, the channel length can be effectively shortened, so that the number of grain boundaries in a single channel is reduced, thereby facilitating the improvement of the mobility of the thin film transistor 3. On the other hand, the volume of the thin film transistor 3 can be effectively reduced, so that the number of the thin film transistors 3 on the insulating substrate 2 per unit area can be improved, and the integration of the thin film transistors 3 can be improved. Therefore, an embodiment of the present disclosure facilitates improving the integration, the maximum operating frequency, and the current density of the thin film transistor 3 in the semiconductor device 1, thereby realizing the high integration of the IC circuit on the insulating substrate 2, thereby realizing the SOG technology.

Figure 10:
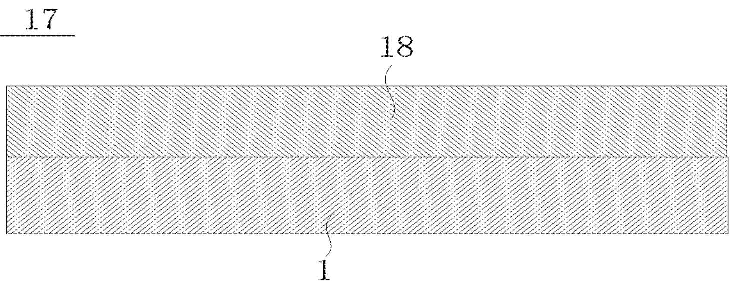
FIG. 10 is a structural schematic diagram of a cross section of a display panel according to an embodiment of the present disclosure.

As shown in FIG. 10, according to an embodiment of the present disclosure, a display panel 17 includes the semiconductor device 1 described in the foregoing embodiment and a light-emitting functional layer 18 on the semiconductor device 1.

In an embodiment, the display panel 17 includes a liquid crystal display panel (LCD). The light-emitting functional layer 18 includes a liquid crystal layer and a color film substrate (CF). The liquid crystal layer is sandwiched between the semiconductor device 1 and the color film substrate.

In another embodiment, the display panel 17 includes an organic electroluminescent display panel, such as an OLED display panel or an LED display panel. The light-emitting functional layer 18 includes an anode, an organic light-emitting layer, and a cathode which are laminated.

By a thin film transistor 3 with a perpendicular structure according to an embodiment of the present disclosure, integration, maximum operating frequency, and current density of the thin film transistor 3 in the semiconductor device 1 can be improved, thereby implementing the high integration of IC circuits on the insulating substrate 2, thereby implementing the SOG technology.

In the above-mentioned embodiments, the descriptions of various embodiments have their own emphases, and parts not described in detail in a certain embodiment may be referred to the related description of other embodiments.

The present disclosure has been described in detail with reference to a semiconductor device and a display panel according to an embodiment of the present disclosure. The principles and embodiments of the present disclosure have been described with reference to specific examples. The description of the above embodiments is merely intended to help understand the technical solution of the present disclosure and the core idea thereof. It will be appreciated by those of ordinary skill in the art that modifications may still be made to the technical solutions described in the foregoing embodiments, or equivalents may be made to some of the technical features therein. These modifications or substitutions do not depart the essence of the corresponding technical solutions from the scope of the technical solutions of various embodiments of the present disclosure.

What is claimed is:

1. A semiconductor device, comprising an insulating substrate and a thin film transistor on the insulating substrate;

wherein the thin film transistor comprises:

a protrusion on a side of the insulating substrate, wherein the protrusion comprises a first sub-protrusion on the insulating substrate, and a second sub-protrusion on the first sub-protrusion, and the second sub-protrusion completely covers a side of the first sub-protrusion away from the insulating substrate; and an active layer, wherein the active layer comprises a first ohmic contact portion, a channel portion connected to the first ohmic contact portion, and a second ohmic contact portion connected to the channel portion;

wherein the first ohmic contact portion is at least partially disposed on the insulating substrate, the channel portion is fitted to a side surface of the first sub-protrusion and a side surface of the second sub-protrusion, and the second ohmic contact part is disposed on a side of the second sub-protrusion away from the first sub-protrusion.

2. The semiconductor device according to claim 1, wherein a side surface of the first sub-protrusion comprises a first sub side surface fitted to the channel portion, the first sub side surface is connected to the side surface of the second sub-protrusion;

an included angle between the side surface of the second sub-protrusion and a bottom surface of the first sub-protrusion is greater than or equal to 85° and less than or equal to 95°, and an included angle between the first sub side surface and the bottom surface of the first sub-protrusion is greater than or equal to 85° and less than or equal to 95°.

3. The semiconductor device according to claim 2, wherein a side surface of the first sub-protrusion further comprises a second sub side surface connected to the first sub side, the first sub side surface is disposed between the second sub side surface and the side surface of the second sub-protrusion, the channel portion is further fitted to the second sub side surface;

an included angle between the second sub side surface and the bottom surface of the first sub-protrusion is less than the included angle between the first sub side surface and the bottom surface of the first sub-protrusion.

4. The semiconductor device according to claim 3, wherein the included angle between the second sub side surface and the bottom surface of the first sub-protrusion is greater than or equal to 30° and less than or equal to 60°.

5. The semiconductor device according to claim 1, wherein a thickness of the first sub-protrusion is greater than a thickness of the second sub-protrusion, and an etch resistance of the second sub-protrusion is greater than an etch resistance of the first sub-protrusion.

6. The semiconductor device according to claim 5, wherein a material of the first sub-protrusion comprises silicon oxide, and a material of the second sub-protrusion comprises polysilicon.

7. The semiconductor device according to claim 1, wherein the channel portion is disposed on a side of the second ohmic contact portion close to the insulating substrate, and the first ohmic contact portion and the second ohmic contact portion do not overlap.

8. The semiconductor device according to claim 1, wherein a material of the first ohmic contact portion and a material of the second ohmic contact portion comprise polysilicon doped with predetermined ions, a doping concentration of the first ohmic contact portion and a doping concentration of the second ohmic contact portion are same, and the material of the first ohmic contact portion and the material of the second ohmic contact portion further comprise undoped polysilicon.

9. The semiconductor device according to claim 8, wherein a thickness of the first ohmic contact portion and a thickness of the second ohmic contact portion are same and greater than a thickness of the second sub-protrusion, a material of the second sub-protrusion comprises polysilicon doped with the predetermined ions, and a doping concentration of the second sub-protrusion is less than a doping concentration of the second ohmic contact portion.

10. A display panel, comprising a semiconductor device and a light-emitting functional layer on the semiconductor device, wherein the semiconductor device comprises an insulating substrate and a thin film transistor on the insulating substrate;

wherein the thin film transistor comprises:

a protrusion on a side of the insulating substrate, wherein the protrusion comprises a first sub-protrusion on the insulating substrate, and a second sub-protrusion on the first sub-protrusion, and the second sub-protrusion completely covers a side of the first sub-protrusion away from the insulating substrate; and an active layer, wherein the active layer comprises a first ohmic contact portion, a channel portion connected to the first ohmic contact portion, and a second ohmic contact portion connected to the channel portion;

wherein the first ohmic contact portion is at least partially disposed on the insulating substrate, the channel portion is fitted to a side surface of the first sub-protrusion and a side surface of the second sub-protrusion, and the second ohmic contact part is disposed on a side of the second sub-protrusion away from the first sub-protrusion.

11. The semiconductor device according to claim 10, wherein a side surface of the first sub-protrusion comprises a first sub side surface fitted to the channel portion, the first sub side surface is connected to the side surface of the second sub-protrusion;

an included angle between the side surface of the second sub-protrusion and a bottom surface of the first sub-protrusion is greater than or equal to 85° and less than or equal to 95°, and an included angle between the first sub side surface and the bottom surface of the first sub-protrusion is greater than or equal to 85° and less than or equal to 95°.

12. The semiconductor device according to claim 11, wherein a side surface of the first sub-protrusion further comprises a second sub side surface connected to the first sub side, the first sub side surface is disposed between the second sub side surface and the side surface of the second sub-protrusion, the channel portion is further fitted to the second sub side surface;

an included angle between the second sub side surface and the bottom surface of the first sub-protrusion is less than the included angle between the first sub side surface and the bottom surface of the first sub-protrusion.

13. The semiconductor device according to claim 12, wherein the included angle between the second sub side surface and the bottom surface of the first sub-protrusion is greater than or equal to 30° and less than or equal to 60°.

14. The semiconductor device according to claim 10, wherein a thickness of the first sub-protrusion is greater than a thickness of the second sub-protrusion, and an etch resistance of the second sub-protrusion is greater than an etch resistance of the first sub-protrusion.

15. The semiconductor device according to claim 14, wherein a material of the first sub-protrusion comprises silicon oxide, and a material of the second sub-protrusion comprises polysilicon.

16. The semiconductor device according to claim 10, wherein the channel portion is disposed on a side of the second ohmic contact portion close to the insulating substrate, and the first ohmic contact portion and the second ohmic contact portion do not overlap.

17. The semiconductor device according to claim 10, wherein a material of the first ohmic contact portion and a material of the second ohmic contact portion comprise polysilicon doped with predetermined ions, a doping concentration of the first ohmic contact portion and a doping concentration of the second ohmic contact portion are same, and the material of the first ohmic contact portion and the material of the second ohmic contact portion further comprise undoped polysilicon.

18. The semiconductor device according to claim 17, wherein a thickness of the first ohmic contact portion and a thickness of the second ohmic contact portion are same and greater than a thickness of the second sub-protrusion, a material of the second sub-protrusion comprises polysilicon doped with the predetermined ions, and a doping concentration of the second sub-protrusion is less than a doping concentration of the second ohmic contact portion.

* * * * *